United States Patent
Cananzi

(10) Patent No.: US 10,298,241 B1
(45) Date of Patent: May 21, 2019

(54) WIDE BANDWIDTH BIDIRECTIONAL CLOCK SYNCHRONIZATION CIRCUIT

(71) Applicant: Arista Networks, Inc., Santa Clara, CA (US)

(72) Inventor: David Anthony Cananzi, Santa Clara, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 0 days.

(21) Appl. No.: 15/468,604

(22) Filed: Mar. 24, 2017

(51) Int. Cl.
- *G06F 1/12* (2006.01)
- *H03L 7/089* (2006.01)
- *H03K 3/3565* (2006.01)

(52) U.S. Cl.
CPC .............. *H03L 7/089* (2013.01); *G06F 1/12* (2013.01); *H03K 3/3565* (2013.01)

(58) Field of Classification Search
CPC .......... G06F 1/12; H03K 3/3565; H03L 7/089
USPC ................... 327/141, 156, 162, 163
See application file for complete search history.

(56) References Cited

U.S. PATENT DOCUMENTS

2003/0001618 A1* 1/2003 Haycock .............. G06F 13/4077 326/82

* cited by examiner

*Primary Examiner* — William Hernandez
(74) *Attorney, Agent, or Firm* — Womble Bond Dickinson (US) LLP

(57) ABSTRACT

A bidirectional clock synchronization circuit is provided. The circuit includes a bidirectional port having an input/output terminal and a transceiver, having a first interface with a unidirectional input and a unidirectional output, and a second interface with a bidirectional input/output coupled to the input/output terminal of the bidirectional port. The circuit includes a phase locked loop (PLL), having an output coupled to the unidirectional input of the transceiver, and having an input coupled to the unidirectional output of the transceiver, the phase locked loop selectable as to frequency range for the input or the output of the phase locked loop.

20 Claims, 5 Drawing Sheets

WIDE BANDWIDTH BIDIRECTIONAL CLOCK SYNCHRONIZATION CIRCUIT

BACKGROUND

Network equipment, as well as other types communication equipment, may require time synchronization that may be associated with a particular protocol, e.g., PTP (Precision Time Protocol). In some systems, a GPS (Global Positioning System) receiver, or a network time grandmaster/master may be utilized to produce an electrical clock signal that can be connected to the equipment in what may be referred to as master mode. Increasingly, the clock signal is delivered over a network in what is known as slave mode. When operating in slave mode it is desirable to provide an electrical clock output to verify the system's synchronization. Network vendors may provide two electrical co-axial ports on network equipment where one serves as a clock input, and the other as a clock output. However, as vendors continually look to add more features and reduce the footprint of the equipment, some vendors may provide only one port that can be utilized for time synchronization. In addition, some equipment may only accept a single type of the many types of synchronization signals available. Synchronizing network equipment without consideration of these variables is a challenge by itself. For customers, verifying and providing network synchronization is a substantial factor in designing clock domain hierarchies and the ability to perform the synchronization is complicated by the differences or variations between equipment vendors. It is within the above context that the present embodiments arise.

SUMMARY

In some embodiments, a bidirectional clock synchronization circuit is provided. The circuit includes a bidirectional port having an input/output terminal and a transceiver, having a first interface with a unidirectional input and a unidirectional output, and a second interface with a bidirectional input/output coupled to the input/output terminal of the bidirectional port. The circuit includes a phase locked loop (PLL), having an output coupled to the unidirectional input of the transceiver, and having an input coupled to the unidirectional output of the transceiver, the phase locked loop selectable as to frequency range for the input or the output of the phase locked loop.

In some embodiments, a network device with a bidirectional clock synchronization circuit is provided. The network device includes a housing having a front panel and a back panel. The front panel or the back panel has a bidirectional port having an input/output terminal. The network device has a transceiver and a frequency-range selectable phase locked loop (PLL), the transceiver selectable to drive an output clock of the phase locked loop out through the input/output terminal of the bidirectional port and selectable to drive an input clock of the phase locked loop in from the input/output terminal of the bidirectional port.

In some embodiments, a method of operating an electronic device with a bidirectional clock synchronization circuit is provided. The method includes selecting a frequency range of a phase locked loop (PLL) of the electronic device. The method includes selecting a transceiver of the electronic device to drive an input clock to the phase locked loop, from an input/output terminal of a bidirectional port of the electronic device. The method includes selecting a differing frequency range of the phase locked loop of the electronic device and selecting the transceiver of the electronic device to drive an output clock from the phase locked loop to the input/output terminal of the bidirectional port of the electronic device.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

The embodiments presented below combine the functions of clock input and clock output into a single port. Depending on the operational mode, the port could be used as either a master input, or slave output. The embodiments save front panel space on the network equipment, and cost by utilizing a single port. More importantly, the embodiments allow to the customer to easily verify their network's synchronization. In output mode, software configuration options are also available to provide a 1 pulse per second (PPS) output, or frequency output for measuring phase alignment, and frequency profiles. In input mode, the wide bandwidth input allows the network device to synchronize on 1 PPS to 10 MHz clock inputs. Further embodiments have other frequency ranges, as suited to the network device or other electronic device.

Embodiments depicted herein make implementations of PTP (IEEE1588), and SyncE (synchronous Ethernet) (ITU Rec. G.8262), among others, easier to construct and verify for a customer. The embodiments enable the ability to perform with a single port what previously required two or more ports. With the circuit described below, it is possible to use a single connection that is adaptable to handle all types of synchronization signals. The embodiments provide for a configurable product that does not sacrifice port space, and reduces cost. As described in more detail below, embodiments of the circuit have some or all of the following features:

Software control
PLL (phase locked loop) with wide bandwidth
Isolation transceiver
Schmitt trigger
Port conflict protection
Surge protection
Connector Software controls the transceiver to be either an input or an output. Software can also control the PLL's signal output (1 PPS, or clock), and signal input (1 PPS, or clock). The bias network provides a Schmitt trigger, which provides noise immunity, and protects against slow signals. ESD (electrostatic discharge) diodes provide surge protection, and a resistor protects against port conflicts if the port is accidently configured as an output while connected to a clock source.

Figure 1A:
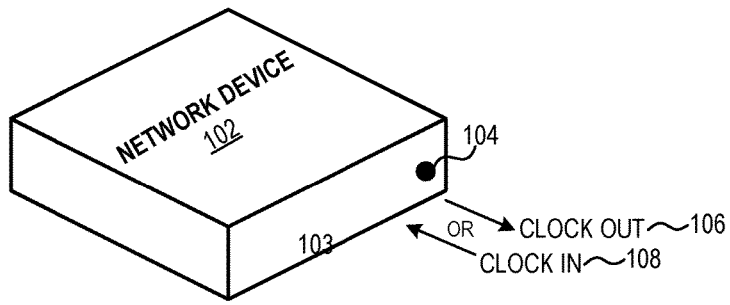
FIG. 1A depicts a network device with a bidirectional port for clock input or clock output in accordance with some embodiments.

FIG. 1A depicts a network device 102 with a bidirectional port 104 for clock input 108 or clock output 106. For example, the network device 102 could be a network switch that uses an externally supplied clock connected to the single, bidirectional port 104 as a clock input 108, for synchronizing the network switch to the externally supplied clock. In some embodiments, the network switch 102 could also drive out an internal clock through the same bidirectional port 104 as the clock output 106, for verifying aspects of the internal clock of the network device.

Figure 1B:
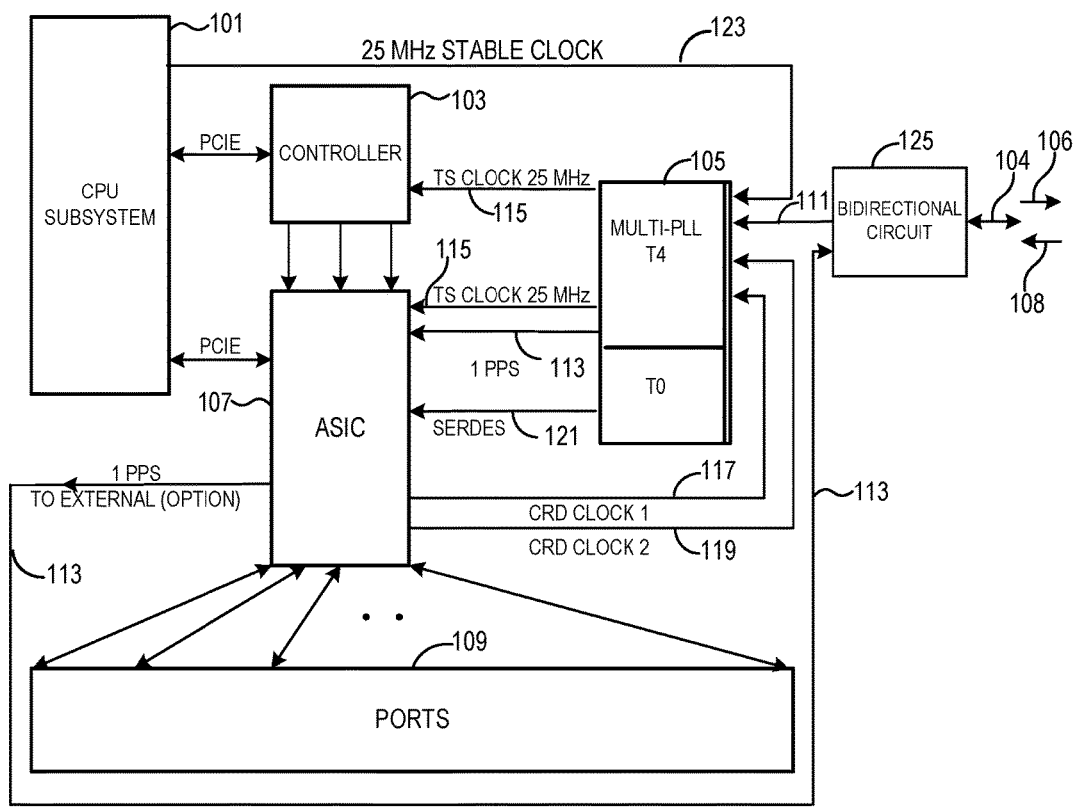
FIG. 1B is an example of electronic circuitry for embodiments of the network device of FIG. 1A in accordance with some embodiments.
Figure 2:
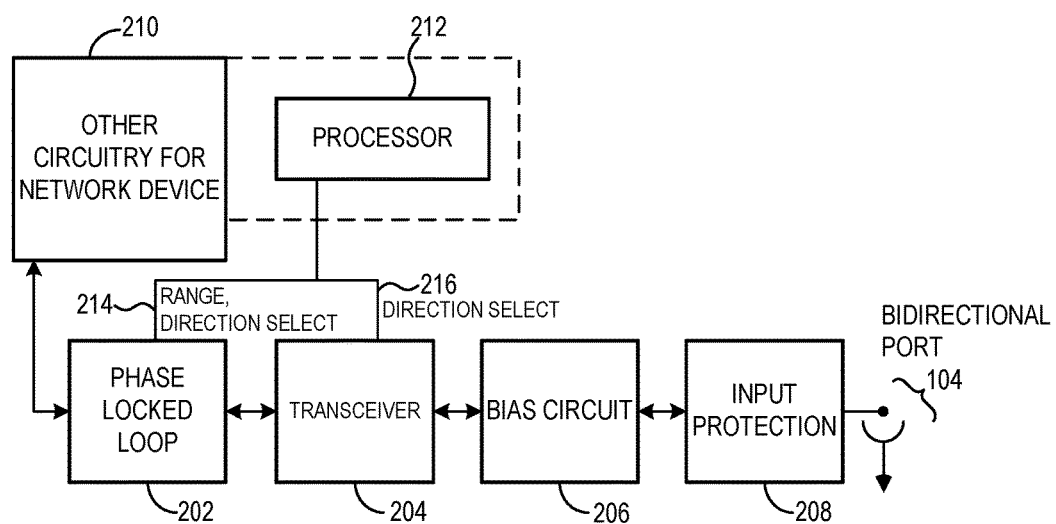
FIG. 2 is a block diagram of a wide bandwidth bidirectional clock synchronization circuit, in an embodiment for the network device with bidirectional port of FIG. 1 in accordance with some embodiments.
Figure 3:
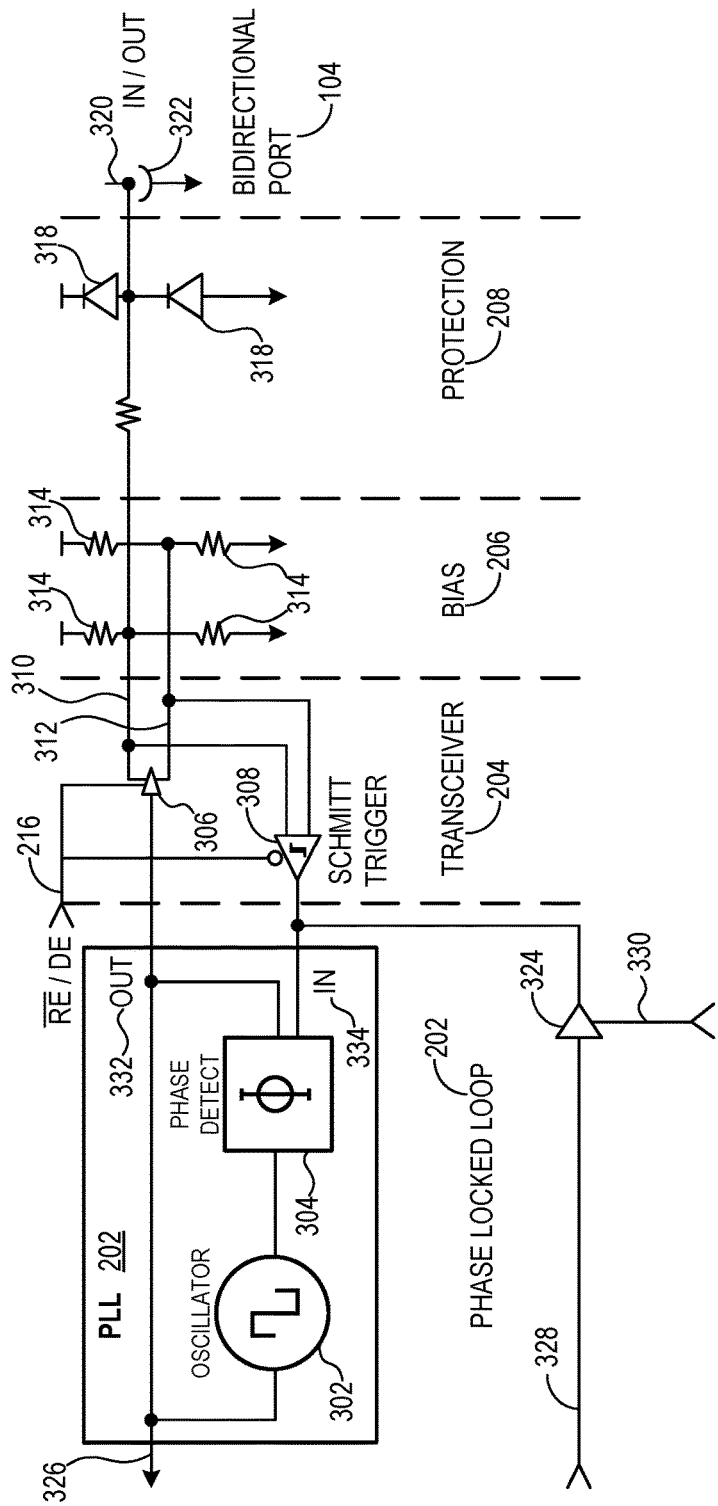
FIG. 3 is a circuit diagram of an embodiment of the wide bandwidth bidirectional clock synchronization circuit of FIG. 2 in accordance with some embodiments.

FIG. 1B is an example of electronic circuitry for embodiments of the network device 102 of FIG. 1A. The clock input 108 from the bidirectional port 104 in FIG. 1A drives the phase locked loop 105 input clock 111 through the bidirectional circuit 125, and the phase locked loop 105 one pulse per second output clock 113 drives the clock output 106 through the bidirectional port 104 and the bidirectional circuit 125, in this embodiment. Details of embodiments of the bidirectional circuit are shown in FIGS. 2 and 3. In FIG. 1B, the phase locked loop 105 supplies a clock 115 to a controller 103 which controls the time setting in some embodiments, which in turn is connected to a processor subsystem 101. In some embodiments clock 115 is a clock for the network physical time counter. A medium speed stable clock 123 is output from the processor subsystem 101 to the phase locked loop 105. The phase locked loop 105 also supplies the one pulse per second output clock 113, the clock 115 and a physical interface (serdes) clock 121 (for SyncE applications) to an application-specific integrated circuit (ASIC) 107. In some embodiments, the medium speed clock 115 is a timeclock for the ASIC time of day counter and the physical interface clock 121 can be decoupled from the medium speed clock 115. Accordingly, FIG. 1B has the multi-PLL divided into T4 (network time) and T0 (physical interface) clock domains. The ASIC 107 is connected to the processor subsystem 101, and supplies a buffered version of the one pulse per second clock 113 from the phase locked loop 105 to the bidirectional port 104 of FIG. 1A. Also, the ASIC 107 outputs a first clock 117 and a second clock 119 to the phase locked loop 105. Various ports 109 are connected to the ASIC 107. Variations on the circuit of FIG. 1B, and further circuits suitable for connection to the bidirectional port 104, are readily devised in keeping with the teachings herein.

FIG. 2 is a block diagram of a wide bandwidth bidirectional clock synchronization circuit, in an embodiment for the network device 102 with bidirectional port 104 of FIG. 1. Circuitry 210 for the network device uses the externally supplied clock from the bidirectional port 104 as a clock input 108, for synchronizing the phase locked loop 202 and/or sends out from the bidirectional port 104 an internal clock from the phase locked loop 202 as the clock output 106 (see FIG. 1). The bidirectional port 104 is shown with a grounded sheath, e.g., as a coaxial connector for coaxial cable, but other types of ports and port connections are readily devised. A processor 212, which could be included as part of the circuitry 210 for the network device, or could be separate from such circuitry 210, communicates with the phase locked loop 202 and the transceiver 204, to select a range of clock frequencies and a direction for the clock, for the phase locked loop 202, and a direction for the transceiver 204 to drive, in some embodiments. Connecting the transceiver 204 to the bidirectional port 104, a bias circuit 206 biases the transceiver 204 and the bidirectional port 104 to a suitable voltage level. An input protection circuit 208 protects circuitry at the bidirectional port 104, for example protecting semiconductor devices in the transceiver and devices in the bias circuit 206. In the embodiment shown, the processor 212 sends range and direction select control signal 214 to the phase locked loop 202, and direction select signal(s) 216 to the transceiver 204. Further versions of control signals from the processor 212 to the phase locked loop 202 and the transceiver 204 are readily devised, in keeping with the teachings herein.

FIG. 3 is a circuit diagram of an embodiment of the wide bandwidth bidirectional clock synchronization circuit of FIG. 2. The phase locked loop 202 in this circuit is depicted as having an oscillator 302 and a phase detect 304, but could also have multiple stages, selectable modules, selectable oscillators 302, or other circuitry for wide bandwidth operation. Particularly, the range selection (e.g., 1 PPS versus 10 MHz or 20 MHz in some embodiments, or other ranges of frequency) could be made by selecting different sections of circuitry in the phase locked loop 202. Also, the phase locked loop 202 could have additional buffering, or amplification, which may be selectable, for driving the clock(s) in various stages or into or out of the phase locked loop 202. For example, the phase locked loop 202 output 326 to the other circuitry 210 for the network device (see FIG. 2) is shown as being driven directly off the oscillator 302, but could have additional buffering or amplification. The other phase locked loop 202 output 332, to the transceiver 204 is also shown as being driven directly off the oscillator 302, but could have additional buffering or amplification. Also, the input 334 to the phase locked loop 202, which goes to the phase detect 304, can be driven by the transceiver 204, or can be driven from an internal clock 328 supplied by the other circuitry 210 for the network device 102. For example, the input 334 to the phase locked loop 202 could be driven through a clock buffer 324 when enabled by a buffer enable 330, e.g., by the processor 212 (see range and direction select control signal 214 to the phase locked loop 202). Drive direction for the phase locked loop 202 is controlled by the direction select signal 216 for the transceiver 204, in some embodiments as described below.

The signal $\overline{RE}$/DE stands for "not receive and drive. It follows a simple truth table $\overline{RE}$/DE STATE
0 Receive: master mode
1 Drive: Slave mode Two amplifiers 306, 308, or buffers or other suitable circuits in the transceiver 204, one a transmitter to drive the phase locked loop 202 clock out, the other a receiver to drive in to the phase locked loop clock, are selectable by the direction select signal 216. In the embodiment shown in FIG. 3, the transmitting amplifier 306 in the transceiver 204 is a single-ended input, differential output amplifier, which buffers or amplifies the phase locked loop 202 output 332 connected as a single-ended input to the amplifier 306, to differential outputs 310, 312. One of the differential outputs 310 is connected to the bias circuit 206, the input protection 208 and the terminal 320 of the bidirectional port 104, to drive the clock output 106 out of the bidirectional port 104 when the appropriate direction is selected for the transceiver 204 and phase locked loop 202. The other differential output 312 of the transmitting amplifier 306 terminates at the bias circuit 206.

In the embodiment shown in FIG. 3, the receiving amplifier 308 in the transceiver 204 is a differential input, single-ended output amplifier that has a Schmitt trigger for enhanced noise immunity. When enabled by the appropriate selection of direction for the transceiver 204, the receiving amplifier 308 buffers or amplifies the clock input 108 from the terminal 320 of the bidirectional port 104. The clock input 108 from the terminal 320 is connected as one of two differential inputs to the receiving amplifier 308, and is amplified to the single-ended output of the receiving amplifier 308, which is connected to the phase locked loop 202 input 334 to the phase detect 304. The other of the two differential inputs of the receiving amplifier 308 is connected to the bias circuit 206.

Thus, the transceiver 204 can drive from the bidirectional port 104 into the phase locked loop 202, through the receiving amplifier 308, and can drive from the phase locked loop 202 out of the bidirectional port 104, through the transmitting amplifier 306. In the embodiment shown, the interface of the transceiver 204 to the phase locked loop 202 is single-ended with a single- and unidirectional output and single-ended unidirectional input. The interface of the transceiver 204 to the bias circuit 206 and facing towards the bidirectional port 104 is bidirectional and has differential signaling, with a single line of the differential signaling coupled to the terminal 320 of the bidirectional port 104, although other arrangements of amplifiers (e.g., bidirectional/bidirectional, single-ended/single-ended, differential/differential, etc.) can be used in further embodiments.

Bias circuit 206 has four resistors 314 to provide a Thévenin equivalent bias, in the embodiment shown. These resistors 314 set the differential lines of the transceiver 204 to a midpoint between two power supply rails. For example, in the embodiment shown, transmitting amplifier 306 differential outputs 310, 312 connected to receiving amplifier 308 differential inputs, would be biased to this midpoint (when not driven by the transmitting amplifier 306). Nominally, in one embodiment, the midpoint is half of the supply voltage, midway between 0 V (ground) and a VCC. In some embodiments, for a clock input 108 that is nominally a square or rectangular wave between the two power supply rails, biasing the differential lines to a midpoint between the two rails gives good noise immunity, better than if the lines were biased to ground or VCC. And, if there were no input clock connected to the bidirectional port 104, it would be undesirable to leave the differential lines floating, so the bias circuit 206 pulls the differential lines to known values. The circuit provides better immunity for clock signals with slow rise time, or clock signals that are sinusoidal. In addition, the circuit provides additional immunity for clocks that are rectangular, and have sharper rise times.

There are two aspects to the input protection circuit 208, each providing a different type of protection to the circuitry. Diodes 318, or other input protection circuit, protect against electrostatic discharge (ESD) and may also protect against over driving the clock input 108 at the bidirectional port 104. A resistor 316, connected in series or in line between the terminal 320 of the bidirectional port and the transceiver 204, protects against driving the bidirectional port 104 from both directions, as both the clock output 106 from the phase locked loop 202 and a clock input 108 from an external source. Thus, the resistor 316 provides port conflict protection by absorbing the voltage difference. The terminal 320 of the bidirectional port 104 is shown with a grounded sheath 322.

Figure 4:
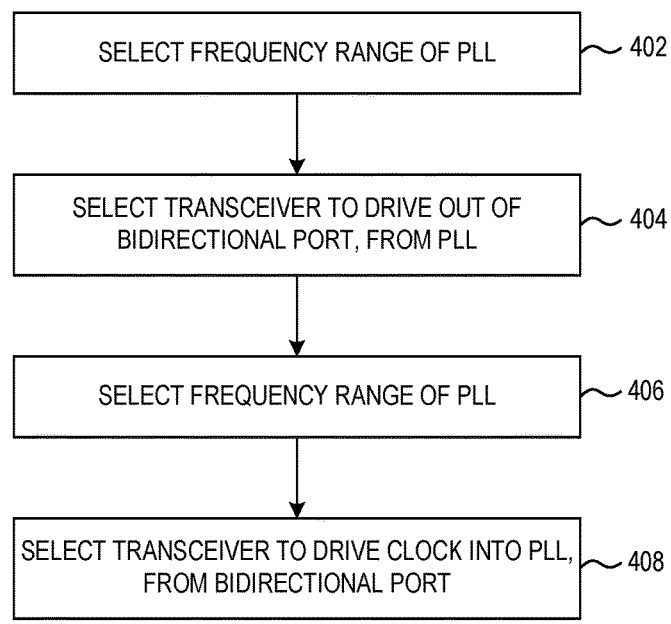
FIG. 4 is a flow diagram of a method of operating an electronic device with a bidirectional clock synchronization circuit, which can be practiced by embodiments shown in FIGS. 1-3 in accordance with some embodiments.

FIG. 4 is a flow diagram of a method of operating an electronic device with a bidirectional clock synchronization circuit, which can be practiced by embodiments shown in FIGS. 1-3. Selecting actions can be performed by a processor, such as described with reference to FIG. 5. In an action 402, the frequency range of the phase locked loop is selected. For example, the processor could communicate a range selection signal to the phase locked loop, which could select or tune an oscillator or switch in or switch out one or more stages in the phase locked loop as appropriate to the selected frequency range of operation. In an action 404, the transceiver is selected to drive out of the bidirectional port, from the phase locked loop. As described above, this could involve selecting and activating a transmitting amplifier of the transceiver and deselecting or deactivating a receiving amplifier of the transceiver. In an action 406, a frequency range of the phase locked loop is selected. This could be the same, or a different frequency range as selected in the action 402, and could be selected in the phase locked loop by similar circuitry as discussed above. In an action 408, the transceiver is selected to drive the clock into the phase locked loop, from the bidirectional port. As described above, this could involve selecting and activating a receiving amplifier of the transceiver and deselecting or deactivating a transmitting amplifier of the transceiver.

Figure 5:
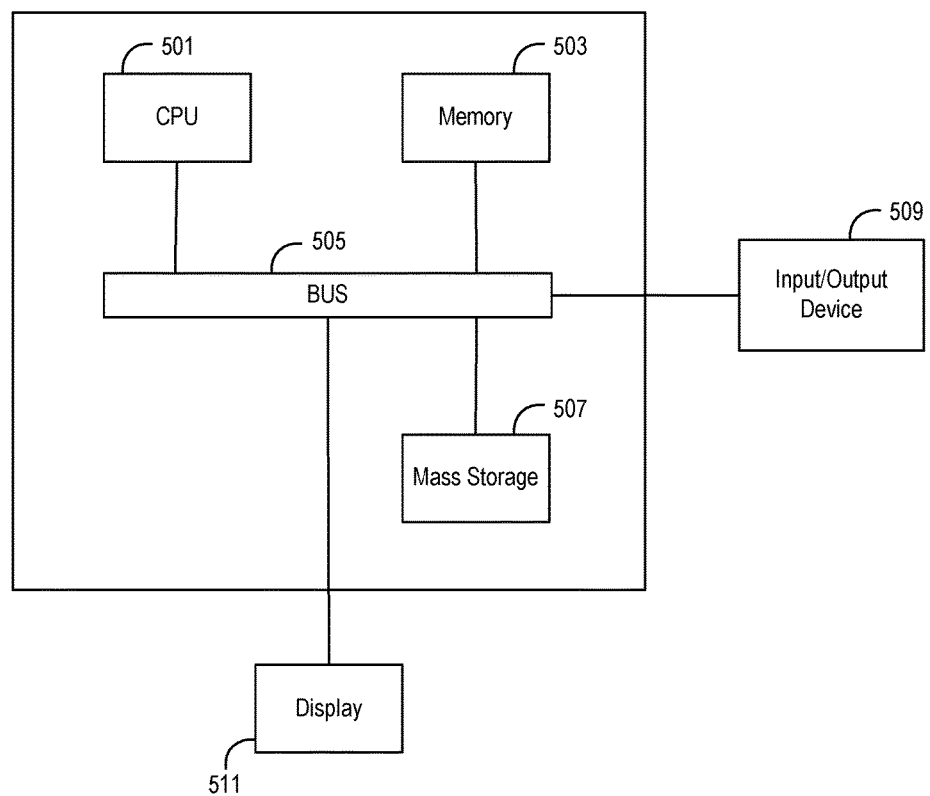
FIG. 5 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 5 is an illustration showing an exemplary computing device which may implement the embodiments described herein. The computing device of FIG. 5 may be used to perform embodiments of the functionality for selecting frequency range of a phase locked loop and/or direction of a transceiver to drive in a wide bandwidth bidirectional clock synchronization circuit in accordance with some embodiments. The computing device includes a central processing unit (CPU) 501, which is coupled through a bus 505 to a memory 503, and mass storage device 507. Mass storage device 507 represents a persistent data storage device such as a floppy disc drive or a fixed disc drive, which may be local or remote in some embodiments. The mass storage device 507 could implement a backup storage, in some embodiments. Memory 503 may include read only memory, random access memory, etc. Applications resident on the computing device may be stored on or accessed via a computer readable medium such as memory 503 or mass storage device 507 in some embodiments. Applications may also be in the form of modulated electronic signals modulated accessed via a network modem or other network interface of the computing device. It should be appreciated that CPU 501 may be embodied in a general-purpose processor, a special purpose processor, or a specially programmed logic device in some embodiments.

Display 511 is in communication with CPU 501, memory 503, and mass storage device 507, through bus 505. Display 511 is configured to display any visualization tools or reports associated with the system described herein. Input/output device 509 is coupled to bus 505 in order to communicate information in command selections to CPU 501. It should be appreciated that data to and from external devices may be communicated through the input/output device 509. CPU 501 can be defined to execute the functionality described herein to enable the functionality described with reference to FIGS. 1A-4. The code embodying this functionality may be stored within memory 503 or mass storage device 507 for execution by a processor such as CPU 501 in some embodiments. The operating system on the computing device may be iOS™, MS-WINDOWS™, OS/2™, UNIX™, LINUX™, or other known operating systems. It should be appreciated that the embodiments described herein may also be integrated with a virtualized computing system that is implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A bidirectional clock synchronization circuit, comprising:
    a bidirectional port having an input/output terminal;
    a transceiver, having a first interface and a second interface, the first interface having a unidirectional input and a unidirectional output, the second interface having a bidirectional input/output coupled to the input/output terminal of the bidirectional port; and
    a phase locked loop (PLL), having an output coupled to the unidirectional input of the transceiver, and having an input coupled to the unidirectional output of the transceiver, the phase locked loop configured to select a frequency range for the input of the phase locked loop coupled to the unidirectional output of the transceiver or the output of the phase locked loop coupled to the unidirectional input of the transceiver.

2. The bidirectional clock synchronization circuit of claim 1, further comprising:
    a bias circuit coupled to the input/output terminal and the bidirectional input/output of the transceiver.

3. The bidirectional clock synchronization circuit of claim 1, further comprising:
    an input protection circuit coupled to the input/output terminal and the bidirectional input/output of the transceiver.

4. The bidirectional clock synchronization circuit of claim 1, wherein the second interface of the transceiver is configured to receive a differential signal and the first interface is coupled through a single-ended connection.

5. The bidirectional clock synchronization circuit of claim 1, wherein the transceiver having the second interface comprises:
    a Schmitt trigger in the transceiver, having an input coupled to the input/output terminal of the bidirectional port.

6. The bidirectional clock synchronization circuit of claim 1, further comprising:
    a resistor coupling the input/output terminal of the bidirectional port and the bidirectional input/output of the transceiver.

7. The bidirectional clock synchronization circuit of claim 1, wherein both the selectable frequency range of the phase locked loop and a drive direction of the transceiver are under software control.

8. A network device with a bidirectional clock synchronization circuit, comprising:
    a network device in a housing having a front panel and a back panel;
    the front panel or the back panel having a bidirectional port having an input/output terminal; and
    the network device having a transceiver and a frequency-range selectable phase locked loop (PLL), the transceiver selectable to drive an output clock of the phase locked loop out through the input/output terminal of the bidirectional port and selectable to drive an input clock of the phase locked loop in from the input/output terminal of the bidirectional port.

9. The network device with the bidirectional clock synchronization circuit of claim 8, further comprising:
    a resistor-based circuit coupled to bias a first differential input of the bidirectional port to a midpoint between two power supply rails and bias a second differential input of the bidirectional port to the midpoint between the two power supply rails.

10. The network device with the bidirectional clock synchronization circuit of claim 8, further comprising:
    a diode-based input protection circuit coupled to the input/output terminal of the bidirectional port.

11. The network device with the bidirectional clock synchronization circuit of claim 8, wherein the transceiver comprises:
    a single-ended input, differential output amplifier having an input terminal coupled to the output clock of the phase locked loop and having a single output terminal coupled to the input/output terminal of the bidirectional port; and
    a differential input, single-ended output amplifier having an output terminal coupled to the input clock of the phase locked loop and having a single input terminal coupled to the input/output terminal of the bidirectional port.

12. The network device with the bidirectional clock synchronization circuit of claim 8, wherein the transceiver comprises a Schmitt trigger having an input coupled to the input/output terminal of the bidirectional port.

13. The network device with the bidirectional clock synchronization circuit of claim 8, further comprising:

a resistor coupled to the input/output terminal of the bidirectional port and the transceiver and arranged for port conflict protection.

14. The network device with the bidirectional clock synchronization circuit of claim 8, further comprising:
the network device having software control of the transceiver and the frequency-range of the phase locked loop.

15. A method of operating an electronic device with a bidirectional clock synchronization circuit, comprising:
selecting a frequency range of a phase locked loop (PLL) of the electronic device;
selecting a transceiver of the electronic device to drive an input clock to the phase locked loop, from an input/output terminal of a bidirectional port of the electronic device;
selecting a differing frequency range of the phase locked loop of the electronic device; and
selecting the transceiver of the electronic device to drive an output clock from the phase locked loop to the input/output terminal of the bidirectional port of the electronic device.

16. The method of claim 15, further comprising:
biasing the input/output terminal of the bidirectional port and an input of the transceiver to a midpoint between two power supply rails.

17. The method of claim 15, wherein the selecting the transceiver to drive the input clock to the phase locked loop comprises:
selecting a differential input, single-ended output amplifier of the transceiver to drive the input clock to the phase locked loop based on a coupling of the input/output terminal of the bidirectional port to one differential input of the differential input, single-ended output amplifier.

18. The method of claim 15, wherein the selecting the transceiver to drive the output clock from the phase locked loop to the input/output terminal of the bidirectional port comprises:
selecting a single-ended input, differential output amplifier of the transceiver to drive the input/output terminal of the bidirectional port from one differential output of the single-ended input, differential output amplifier based on a coupling of the output clock of the phase locked loop to the single-ended input of the single-ended input, differential output amplifier.

19. The method of claim 15, wherein the selecting the transceiver to drive the input clock to the phase locked loop comprises:
passing the input clock from the input/output terminal of the bidirectional port into a Schmitt trigger.

20. The method of claim 15, further comprising:
determining the frequency range and a direction of the transceiver, wherein the selecting the frequency range and the selecting the transceiver to drive the input clock are under software control of the electronic device.

* * * * *